United States Patent [19]

Shubat et al.

[11] Patent Number: 4,939,392

[45] Date of Patent: Jul. 3, 1990

[54] OUTPUT CIRCUIT FOR DRIVING A MEMORY DEVICE OUTPUT LEAD INCLUDING A THREE-STATE INVERTING BUFFER AND A TRANSFER GATE COUPLED BETWEEN THE BUFFER INPUT LEAD AND THE BUFFER OUTPUT LEAD

[75] Inventors: Alexander Shubat, Newark; Barmak Sani, Cupertino, both of Calif.

[73] Assignee: WaferScale Integration, Inc., Fremont, Calif.

[21] Appl. No.: 231,123

[22] Filed: Aug. 11, 1988

[51] Int. Cl.$^5$ .................... H03K 19/00; H03K 19/096
[52] U.S. Cl. ..................................... 307/473; 307/475; 307/452; 307/480
[58] Field of Search .............. 307/473, 475, 443, 452, 307/479, 530, 270, 264, 480; 365/189

[56] References Cited

U.S. PATENT DOCUMENTS

| | | | |
|---|---|---|---|
| 3,769,525 | 10/1973 | Foss et al. | 307/291 |
| 4,216,390 | 8/1980 | Stewart | 307/279 |
| 4,626,713 | 12/1986 | Lee | 307/548 |
| 4,638,183 | 1/1987 | Rickard et al. | 307/272.1 |
| 4,703,198 | 10/1987 | Porter et al. | 307/473 |
| 4,733,112 | 3/1988 | Yamaguchi | 307/530 |

FOREIGN PATENT DOCUMENTS 0025419 2/1984 Japan ................................ 307/473

OTHER PUBLICATIONS

Grimes, "Ternary CMOS Logic Device", IBM Tech. Disclosure, vol. 17, No. 4, Sep. 74, pp. 1145–1146.
Wada, et al., "A 34-ns 1-Mbit CMOS SRAM Using Triple Polysilicon", IEEE Journal of Solid State Circuits, Oct., 1987.
Komatsu, et al., "A 35-ns 128K×8 CMOS SRAM", IEEE Journal of Solid State Circuits, Oct., 1987.
Ali, et al., "A 50-ns 256K CMOS Split-Gate EPROM", IEEE Journal of Solid State Circuits, Feb., 1988.

Primary Examiner—Stanley D. Miller
Assistant Examiner—Timothy P. Callahan
Attorney, Agent, or Firm—Skjerven, Morrill, MacPherson, Franklin & Friel

[57] ABSTRACT

A novel circuit is coupled to a memory device sense amplifier and a memory device output pin for driving the output pin with data. The circuit includes a first inverter (18) and a second inverter (100) coupled to the first inverter. Transfer gates (30, 104) are coupled across the input and output leads of the first and second inverters, respectively. During a first mode of operation, the first and second transfer gates are closed and the second inverter is three-stated so that the input and output leads of the first and second inverters are held at a voltage between VCC and ground. When it is desired to drive the memory device output pin with data, the first and second transfer gates open, and the second inverter leaves the three-state mode and goes into a low output impedance mode. Because the input and output leads of the first and second inverters are held at a voltage between VCC and ground when the transfer gates are closed, when the transfer gates open, the delay between the time the transfer gates open and the time valid output data appears on the output lead of the second inverter is minimized. The second inverter comprises large transistors and can therefore provide a large output current. However, because the second inverter is three-stated when the second transfer gate is closed, the circuit draws minimal power when the first and second transfer gates are closed.

11 Claims, 8 Drawing Sheets

OUTPUT CIRCUIT FOR DRIVING A MEMORY DEVICE OUTPUT LEAD INCLUDING A THREE-STATE INVERTING BUFFER AND A TRANSFER GATE COUPLED BETWEEN THE BUFFER INPUT LEAD AND THE BUFFER OUTPUT LEAD

BACKGROUND OF THE INVENTION

1. Field of the Invention

This invention relates to circuits for driving a data line with a data signal, and more particularly to circuits for driving a data line with information retrieved from a memory array.

2. Description of the Prior Art

Typical memory circuits include an array of memory cells which are coupled to bit lines. The memory cells exhibit high output impedance and small output voltage swings, and the bit lines are capacitive. The bit lines are selectively coupled to amplification circuitry which drives an output pin in response to the signal on the bit lines. Of importance, it is desirable that the amplification circuitry exhibit low power dissipation and a fast response time. Unfortunately, in the past, it has been difficult to simultaneously attain both low power dissipation and a fast response time.

Figure 1:
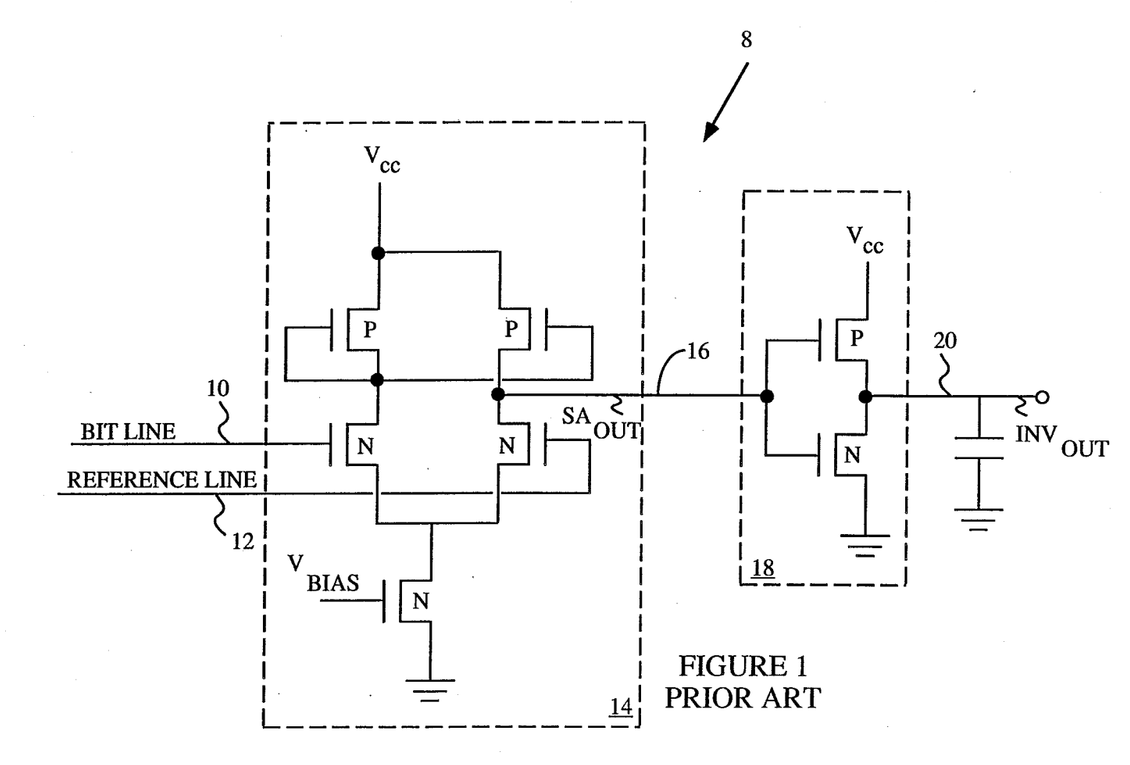
FIG. 1 illustrates a first driver circuit constructed in accordance with the prior art.
Figure 2:
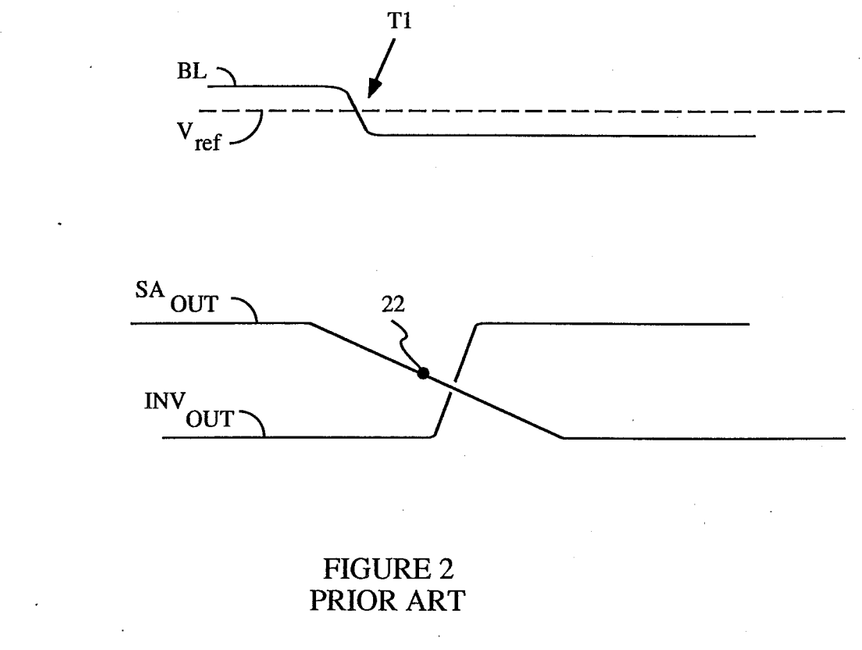
FIG. 2 illustrates various waveforms generated by the circuit of FIG. 1.

FIG. 1 illustrates a prior art circuit 8 for driving an output lead 20 of a memory device. Referring to FIG. 1, a bit line 10 and reference line 12 are coupled to at least one memory cell (not shown) within an array of memory cells. Bit line 10 and reference line 12 are also coupled to a sense amplifier 14 which generates therefrom an output signal $SA_{OUT}$ on an output lead 16. Output lead 16 is coupled to an inverter 18 which in turn drives output lead 20 with a signal $INV_{OUT}$. The timing for the signals provided by circuit 8 is illustrated in FIG. 2. Referring to FIG. 2, at a time T1, data from the memory device is read, thereby causing the signal BL on bit line 10 to go low if the memory cell stores a "0". (The present description is directed toward the case in which bit line 10 is originally charged to a high voltage, i.e. bit line 10 is originally coupled to a cell which stores a 1, and is then coupled to a memory cell which stores a 0 at time T1. It is understood, however, that circuit operation would be similar if the voltage at bit line 10 was originally low and then bit line 10 was coupled to a memory cell which stored a 1.)

Output lead 16 is capacitive and sense amplifier 14 exhibits a high output impedance. Therefore output signal $SA_{OUT}$ from sense amplifier 14 changes slowly after time T1. Of importance, as soon as signal $SA_{OUT}$ crosses a voltage trigger point 22, output signal $INV_{OUT}$ generated by inverter 18 rises rapidly. (Inverter 18 is provided, in part, to permit the memory device to provide a steady state output signal on lead 20 without waiting for signal $SA_{OUT}$ to fall to ground.)

Figure 3:
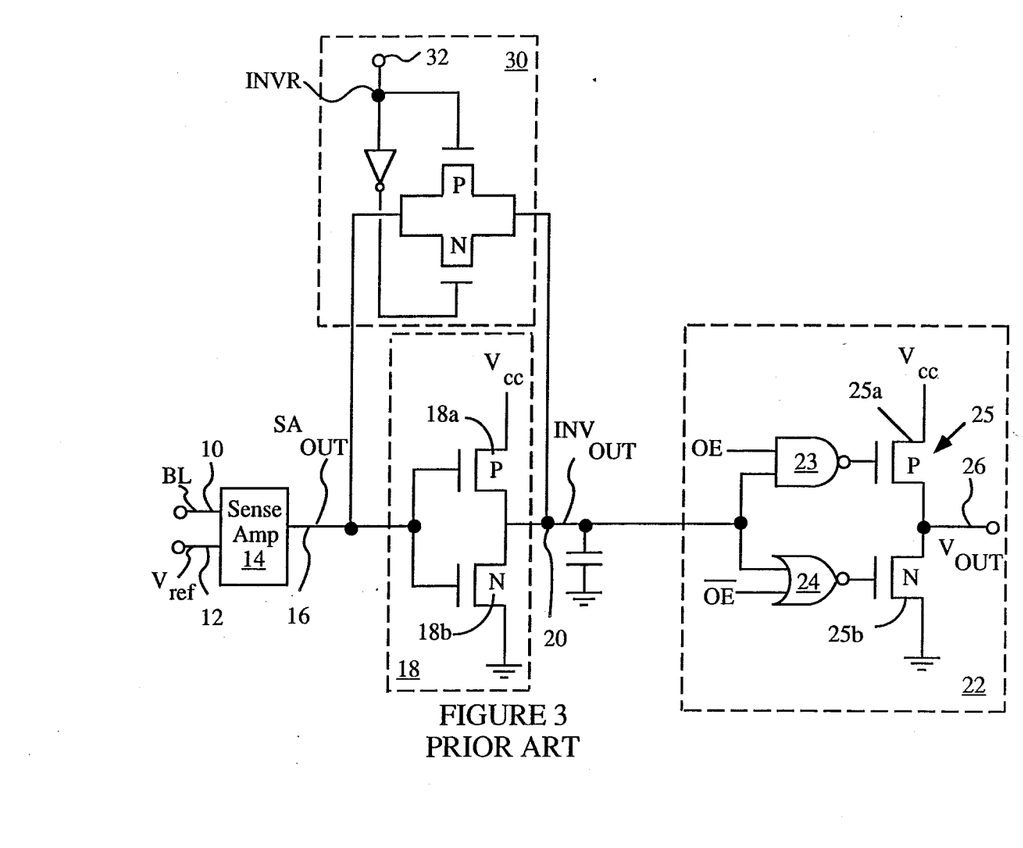
FIG. 3 illustrates a second driver circuit constructed in accordance with the prior art.

As mentioned above, it is desirable to reduce the delay between the time a memory cell is connected to sense amplifier 14 and the time valid output data is provided. In order to reduce the delay between time T1 and the time inverter 18 provides valid output data on lead 20, it is known to couple a transfer gate 30 across the input and output leads of inverter 18 as illustrated in FIG. 3. To understand how this structure works, reference is made to the timing diagram of FIG. 4. During an initial time period T2, signal INVR is inactive, transfer gate 30 is open, sense amplifier 14 receives bit line output signal BL from a first memory cell (which stores a 1) and provides signal $SA_{OUT}$ in response thereto. (Signal $SA_{OUT}$ is approximately 4 volts when reading a memory cell which stores a 1.) At the end of period T2, signal INVR goes active, transfer 30 closes, the output signal from inverter 18 is provided as the input signal to inverter 18 and therefore, the voltages at the input and output leads of inverter 18 are held at the same level, i.e., at approximately the midpoint of the voltage swing of inverter 18 (about 2.5 volts). Thereafter, the address received by the memory device changes, and at time T3, bit line 10 is connected to a second memory cell (which stores a 0), and signal BL starts to fall. However, because signal INVR is active, output lead 16 of sense amplifier 14 remains at the midpoint of the voltage swing of inverter 18. When it is desired to read the data stored in the second memory cell, signal INVR goes inactive (high) and transfer gate 30 opens (time T5). Of importance, at time T5, signal BL has fallen below voltage $V_{ref}$, and output signal $SA_{OUT}$ from sense amplifier 14 is permitted to fall. Since the input lead of inverter 18 is at the inverter trigger point when transfer gate 30 opens, output signal $SA_{OUT}$ falls below the trigger point of inverter 18 almost immediately, and output signal $INV_{OUT}$ from inverter 18 rises rapidly. Thus, it is seen that by providing transfer gate 30 to hold the signal at lead 16 half way between ground and VCC, the delay between the time signal BL falls below voltage $V_{ref}$ (time T4) and the time signal $SA_{OUT}$ falls below trigger point 22 can be reduced. This is because it is not necessary to wait for sense amplifier 14 to discharge output lead 16 from 4 volts (the voltage on lead 16 when sense amplifier 14 senses a 1 on bit line 10, e.g. prior to time T2) to the trigger point of inverter 18 (the input lead of inverter 18 is already held at the trigger point by transfer gate 30). Thus, the delay between time T3 and the time output signal $INV_{OUT}$ goes high is dramatically reduced.

Figure 4:
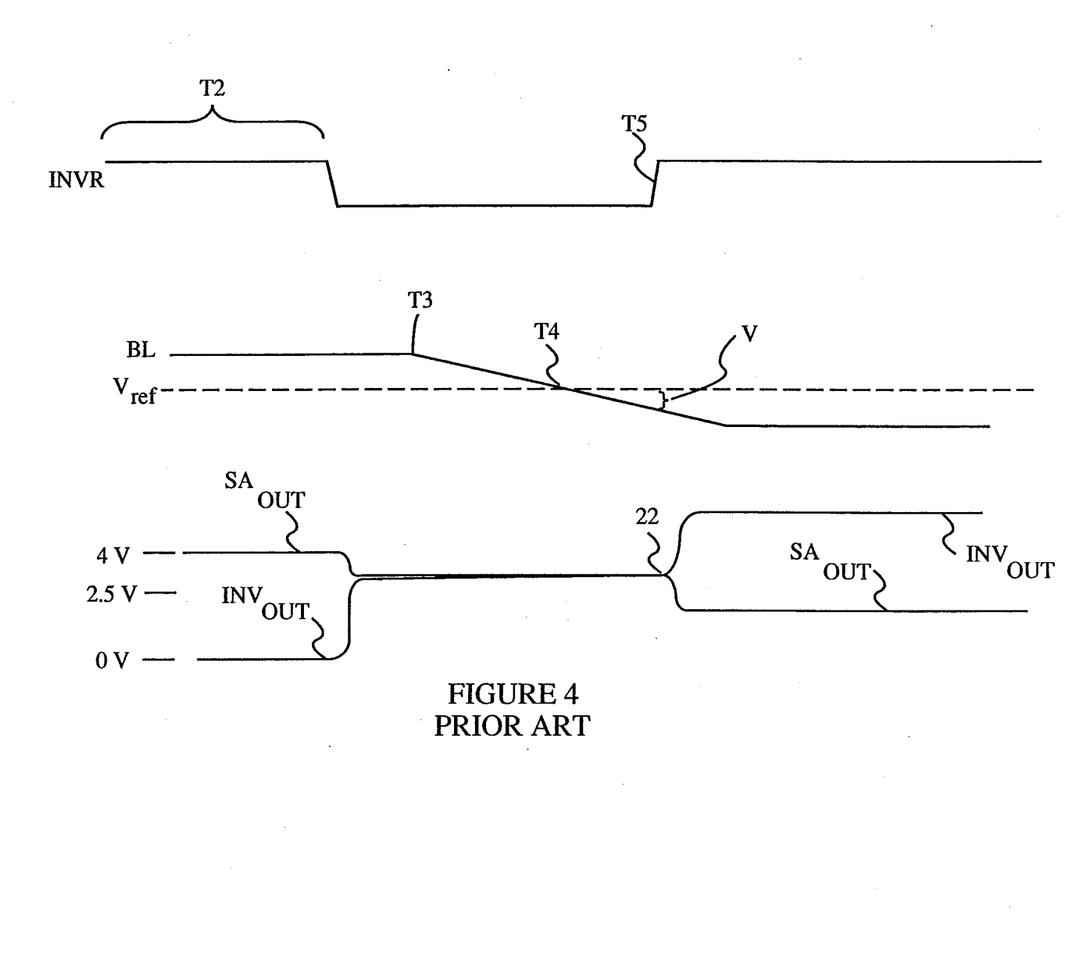
FIG. 4 illustrates various waveforms generated by the circuit of FIG. 3.

It is noted that signal INVR is timed to go inactive after signal BL falls at least a predetermine voltage drop V (e.g. about 100 mV) below voltage $V_{ref}$. This is done to ensure that at time T5, sense amplifier 14 will start driving lead 16 with a voltage level which accurately reflects the state of the memory cell being read.

Signal $INV_{OUT}$ is coupled to a three-state buffer circuit 22 which drives an output lead 26. Three-state buffer circuit 22 is capable of going into a high impedance mode (also known as a three-state mode or a tri-state mode) in response to a signal OE going inactive, so that other circuitry external to the memory circuit, can drive lead 26. Circuit 22 includes a NAND gate 23, a NOR gate 24, and an output stage 25. Output stage 25 provides signal $V_{OUT}$ on an output lead 26 when signal OE is active (i.e. signal OE is high and signal $\overline{OE}$ is low). Three-state buffer circuit 22 goes into the three-state mode in which transistors 25a and 25b are both off when signal OE is inactive.

A structure similar to that of FIG. 3 is discussed by S. Ali et al. in "A 50-ns 256K CMOS Split-Gate EPROM", published in IEEE Journal of Solid-State Circuits in Feb., 1988, incorporated herein by reference.

Figure 5:
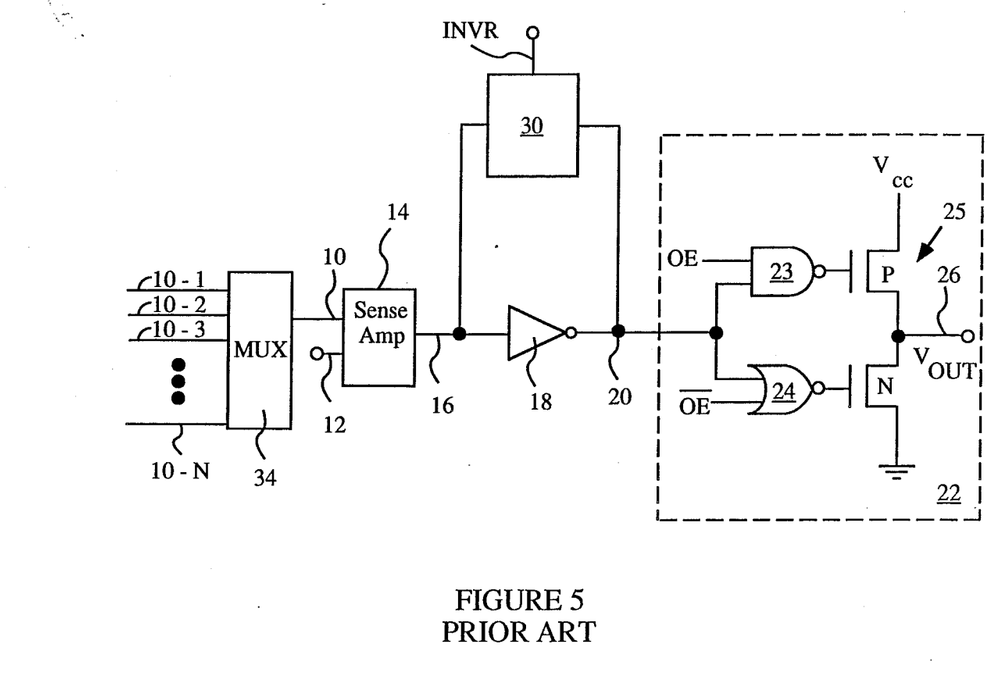
FIGS. 5 and 6 illustrate prior art circuits for coupling a plurality of bit lines to an output buffer circuit.

As more memory cells are integrated into high density memories such as DRAMs, SRAMs, and EPROMs, it is necessary to be able to selectively drive output lead 26 with data from a larger number of bit lines. This can be done by connecting a large number of bit lines 10-1 to 10-N to a multiplexer 34, which selects one of the bit lines to drive sense amplifier 14 (FIG. 5). However, as the number of bit lines coupled to multiplexer 34 increases, so does the capacitive loading of input lead 10 of sense amplifier 14. Thus, the time required to provide valid data on input lead 10 also increases.

Figure 6:
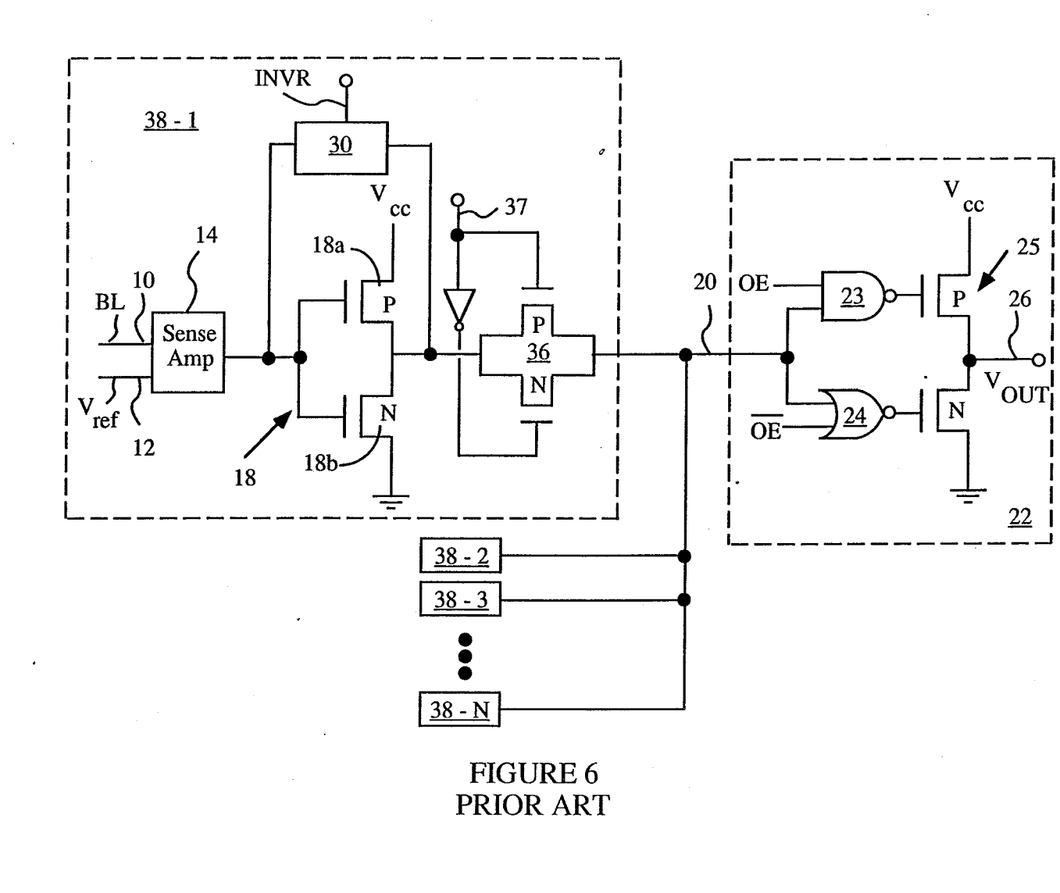

Another technique for integrating more bit lines onto the memory device is to provide a plurality of sense amplifiers such as sense amplifier 14 and inverters such as inverter 18 and connect each of the inverters to three-state buffer circuit 22 via a transfer gate such as transfer gate 36. (FIG. 6). Transfer gate 36 is controlled by a signal on lead 37. (In FIG. 6, blocks 38-2 to 38-N are identical to the circuitry in block 38-1). Unfortunately, if this is done, the capacitive loading on the input lead of buffer circuit 22 is increased, thus adding to the propagation delay of the output circuit. To enhance the speed with which signals are provided to buffer circuit 22, inverter 18 and the corresponding inverters in blocks 38-2 to 38-N must comprise very large transistors which provide a large switching current. Unfortunately, this also causes high power dissipation when transfer gate 30 is closed. (Of importance, inverter 18 typically comprises a P channel MOS transistor 18a and an N channel MOS transistor 18b which are both on when transfer gate 30 is closed.) Also, if the size of transistors 18a and 18b is increased, the loading on sense amplifier 14 is increased, thereby slowing the memory device. It would be desirable to reduce the power dissipation of inverter 18 and increase the speed with which data is provided on data line 20.

SUMMARY

A driver circuit constructed in accordance with our invention comprises a first inverter having an input lead coupled to a sense amplifier and a second inverter having an input lead coupled to the output lead of the first inverter. The second inverter drives a data output line which is typically capacitive. A first transfer gate is coupled across the first inverter and a second transfer gate is coupled across the second inverter. Of importance, the second inverter comprises large transistors and is thus capable of providing a large output current. Also of importance, the second inverter is capable of going into a three-state mode when the first and second transfer gates are closed so that when the transfer gates are closed, the second inverter will not draw a large current. The first inverter comprises small MOS transistors and thus draws minimal current when the transfer gates are closed. Also, because the second inverter includes small MOS transistors, the sense amplifier need only drive a small load.

When the first and second transfer gates are closed, the first inverter holds the first inverter input lead, the input lead of the second inverter and the output lead of the second inverter at a voltage approximately equal to the midpoint between VCC and ground. When the transfer gates open, the delay between the time the transfer gates open and the time valid output data is provided by the second inverter is small because the output lead of the second inverter and the input lead of the second inverter are held near the trigger point of the second inverter. The above-mentioned time delay is also small because the second inverter can provide a large output current.

In one embodiment, a plurality of circuits, each including first and second inverters and first and second transfer gates coupled as described above are provided such that the output leads of the second inverters are connected to a common data line. When the transfer gates are closed, all of the second inverters are in the three-state mode. When the transfer gates open, one of the second inverters drives the common data line. The common data line is capacitively loaded since it is coupled to the second inverters. Thus, instead of adding to the capacitive load on the sense amplifier input lead (which is driven by memory cells exhibiting high output impedance), the capacitive load on the common data line is increased. This does not significantly degrade the speed of the memory device because of the high output current capability of the second inverters.

These and other advantages of the present invention are better understood with reference to the detailed description below.

DETAILED DESCRIPTION

Figure 7:
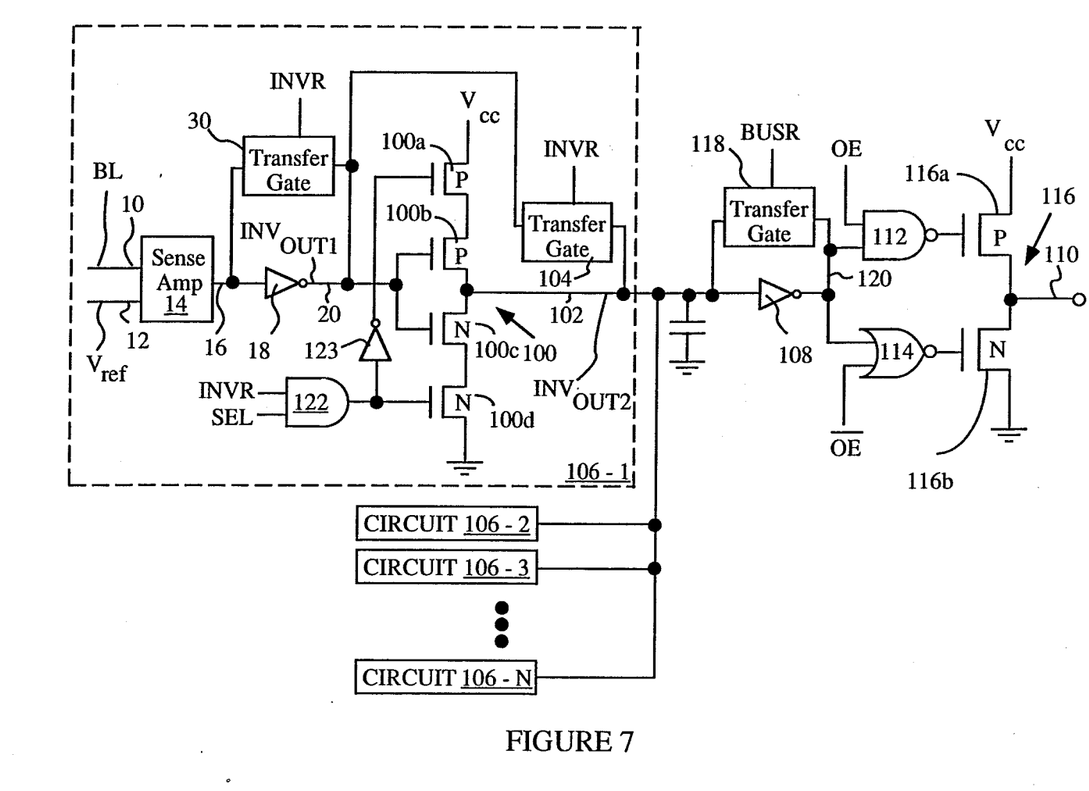
FIG. 7 illustrates a driver circuit constructed in accordance with our invention.

Referring to FIG. 7, bit line 10 and reference line 12 are coupled to sense amplifier 14 in the same manner as illustrated in FIGS. 1 and 3. Similarly, output lead 16 of sense amplifier 14 is coupled to an inverter 18 which in turn provides output signal $INV_{OUT1}$ on output lead 20. In addition, transfer gate 30 is provided to selectively couple the input lead of inverter 18 to the output lead of inverter 18 so that both leads will be held at a voltage approximately halfway between ground and VCC when transfer gate 30 is closed.

In accordance with one novel feature of our invention, output lead 20 of inverter 18 is coupled to an inverter 100 which in turn drives an output lead 102 with a signal $INV_{OUT2}$. A transfer gate 104 selectively connects the input lead of inverter 100 to output lead 102 of inverter 100 in response to control signal INVR. Output lead 102 of inverter 100 is long, capacitive, and coupled to a large number of circuits 106-2 to 106-N identical to circuit 106-1. Of importance, inverter 100 comprises large MOS transistors and is thus capable of driving output lead 102 with a large amount of current. However, because of the manner in which inverter 100 is constructed, inverter 100 does not draw a large amount of power when transfer gate 104 is closed and the input lead of inverter 100 is coupled to output lead 102 of inverter 100. The reason for this is that inverter 100 includes four transistors 100a to 100d coupled between the VCC voltage supply lead and ground. Of importance, transistors 100a and 100d are coupled to a circuit including AND gate 122 and an inverter 123 which ensure that transistors 100a and 100d only turn on when signal INVR is high (i.e., when transfer gate 104 is open). Thus, there is only a short time period during which transistors 100a to 100d all conduct current and draw a large amount of power. (This time period is very brief, and occurs when inverter 100 changes state, and is similar to the dynamic current which flows when conventional CMOS inverters change state).

In one embodiment, the width of the P channel transistors in inverters 100 and 18 are 100 μm and 15 μm, respectively, and the widths of the N channel transistors in inverters 100 and 18 are 30 μm and 7 μm, respectively. The length of the N channel transistors in inverters 100 and 18 is 2 μm and the length of the P channel transistors is 2.2 μm. When transfer gate 30 closes, inverter 18 typically draws a current of about 2 mA. Since transistor current flow is approximately proportional to transistor width, if transistors 100d to 100d were all on, inverter 100 would draw between 5 and 7 times the current of inverter 18. However, as mentioned above, this is prevented by turning off transistors 100a and 100d when transfer gate 104 is closed.

Output lead 102 is coupled to a third inverter 108 which in turn drives an output lead 110 via a NAND gate 112, a NOR gate 114 and an output stage 116. Of importance, a transfer gate 118 is coupled across the input lead of inverter 108 and output lead 120 of inverter 108.

Figure 8:
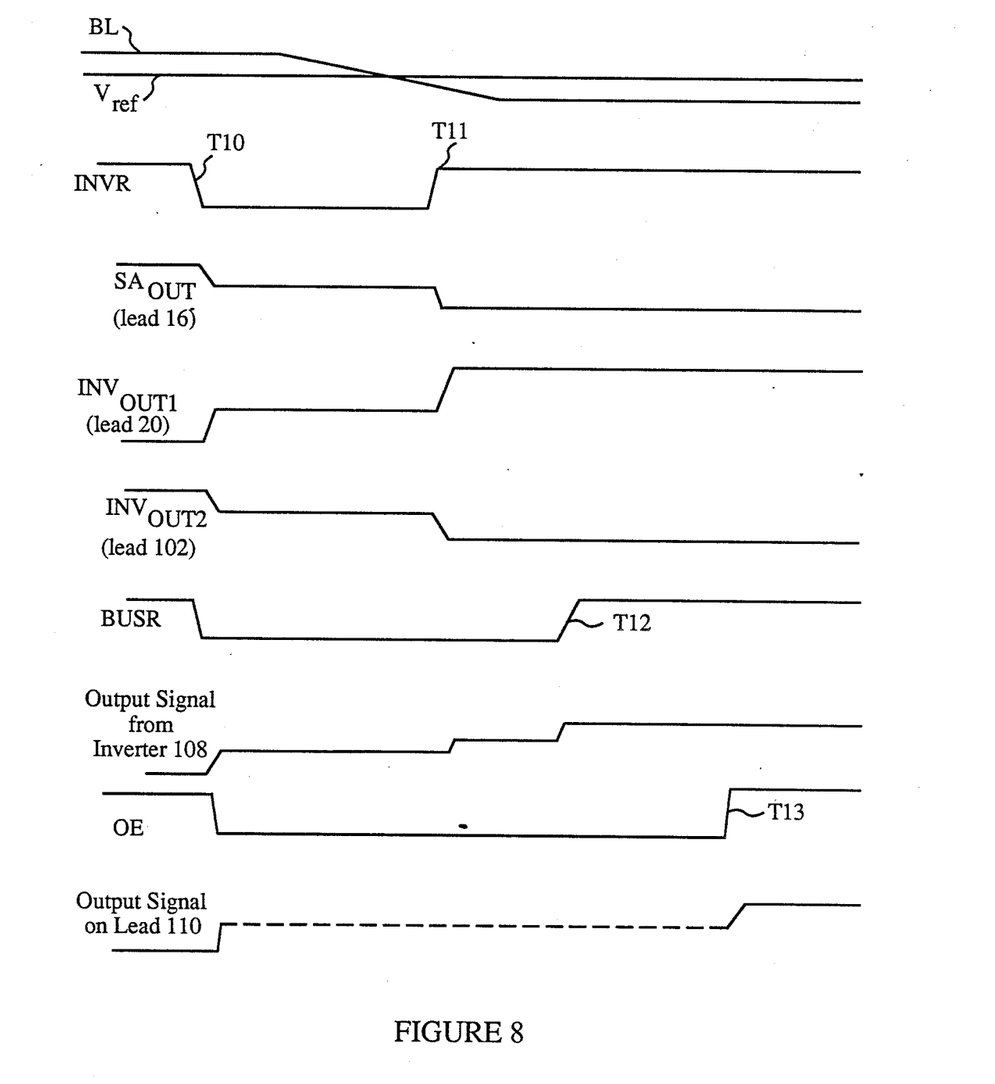
FIG. 8 illustrates various waveforms generated by the circuit of FIG. 7.

FIG. 8 illustrates waveforms generated at various points within the circuit of FIG. 7. Referring to FIG. 8, before a time T10, a first memory cell coupled to bit line 10 is read, signals INVR and BUSR are inactive, signal OE is active, transfer gates 30 and 118 are open, and an output signal is provided at output lead 110. At time T10, signals INVR and BUSR go active, thus closing transfer gates 30 and 118, and signal OE goes inactive.

Between time T10 and T11, bit line 10 is disconnected from a first memory cell (not shown) providing a high signal and is connected to a second memory cell (not shown) which provides a low signal. Also, between times T10 and T11, signal INVR is low (active) and therefore, transfer gates 30 and 104 are both closed, transistors 100a and 100d are off, and signal BUSR is low, thereby closing transfer gate 118. Because of this, the voltage at leads 16, 20, 102 and 120 are held at a voltage approximately equal to VCC divided by 2. The output impedance of sense amplifier 14 is much greater than the output impedance of inverter 18 and the impedance of closed transfer gate 30. Therefore, sense amplifier 14 exhibits only minimal influence on the voltage at output lead 16. Also of importance, when transfer gates 30 and 118 are closed, both inverters 18 and 108 help pull the input and output leads of inverter 100 to about VCC/2.

At time T11, signal INVR goes high, thereby opening transfer gates 30 and 104. Because of this, the voltage at lead 16 changes state almost immediately (lead 16 is short and exhibits low capacitance), the voltage at lead 20 changes almost immediately thereafter (lead 20 is also short and exhibits low capacitance) and the voltage at lead 102 changes almost immediately after the voltage at lead 20 changes. (Although lead 102 is long and highly capacitive, inverter 100 drives lead 102 with a large current.)

The timing for signal INVR is such that signal INVR does not go inactive until it is assured that signal BL has settled to an extent that the difference between voltage $V_{ref}$ and signal BL is at least a predetermined amount, e.g. 100 mV, so that when transfer gate 30 opens, it is assured that inverter 18 will start pulling lead 20 in the correct direction.

Between times T11 and T12, inverter 100 drives lead 102 with data signal $INV_{OUT2}$ while inverter 108 attempts to drive lead 102 with a low signal via transfer gate 118. However, because inverter 108 has a much greater output impedance than inverter 100, inverter 108 has only a minimal effect on the voltage at output lead 102. Inverter 108 does not have a large effect on the output signal of inverter 100 for the additional reason that the transistors in transfer gate 118 are small and exhibit resistance.

At time T11, inverter 100 starts driving inverter 108 with an output signal. Thus, when signal BUSR goes high (time T12), thereby opening transfer gate 118, the input lead of inverter 108 is already pulled low, and inverter 108 drives output lead 120 with a data output signal almost immediately thereafter.

Between times T11 and T12, when the input signal of inverter 108 is pulled low, the output lead of inverter 108 is also pulled low via transfer gate 118 but is simultaneously pulled high by inverter 108. Because the sum of the output impedence of inverter 100, the impedance of lead 102, and the impedance of transfer gate 118 is greater than the output impedance of inverter 108, the voltage at output lead 120 is pulled up, but not as high as it would be if transfer gate 118 were open. Thus, when transfer gate 118 does open, lead 120 is not charge from ground to VCC, but only from a voltage greater than ground to VCC. Therefore, the delay between the time transfer gate 118 opens and the time valid data appears on output lead 110 is reduced for this reason as well.

Output lead 120 is coupled to a circuit including NAND gate 112, NOR gate 114, and an output stage 116. Of importance, when output enable signal OE is low (and signal $\overline{OE}$ is high), P channel transistor 116a and N channel transistor 116b of output stage 116 are both off and therefore output stage 116 is three-stated. However, when signal OE goes high (time T13), this causes output stage 116 to drive output lead 110 with a signal equal to the signal present at lead 120. Thus, at time T13, output stage 116 goes from a three-state mode, illustrated by the dotted lines in FIG. 8, into a mode in which output stage 116 drives output lead 110 with data.

In one embodiment of out invention, signal OE is provided by a microprocessor (not shown) coupled to the memory device and output lead 110 is coupled to the data bus of the microprocessor. Also, in one embodiment of our invention, signals INVR and BUSR are generated by internal control logic (not shown) within the memory device.

It will be appreciated in light of the present application that because of the manner in which lead 102 is driven, the propagation delay between sense amplifier 14 and output lead 110 is minimized. In addition, because of the unique construction of inverter 100, it is possible to set the voltage at leads 16, 18, 102 and 120 at a point intermediate VCC and ground without significantly causing circuit 106-1 to consume a great amount of power. Further, because inverter 100 only drives lead 102 when sense amplifier 14 is selected as a source of data and is otherwise three-stated, inverter 100 and corresponding inverters within circuits 106-2 to 106-N can be coupled directly to lead 102 since only one of these inverters will be enabled at any one time.

As can be seen in FIG. 7, inverter 100 is enabled by AND gate 122 when signal INVR and a select signal SEL are both active. Signal SEL is generated by control circuitry within the memory device and controls whether inverter 100 is to provide the data which is to be presented on output lead 110.

As mentioned above, the present description is directed to a situation in which signal BL goes from a high state to a low state. The circuit operates in a similar manner when signal BL goes from a low state to a high state.

While the invention has been described with regard to a specific embodiment, those skilled in the art will recognize that changes can be made in form and detail without departing from the spirit and scope of the invention. For example, the driver discussed above can be used in conjunction with EPROMs, EEPROMs, ROMs, static RAMs, dynamic RAMs, or any other type of memory circuit. Also, in one embodiment, a plurality of bit lines are coupled to sense amplifier 14 via a multiplexer. Accordingly, all such changes come within the present invention.

I claim:

1. Circuit for providing an output signal, said circuit comprising:
   buffer means having a buffer means input lead for receiving an input voltage at or between a first voltage and a second voltage, a buffer means output lead, and a three-state control lead, said buffer means providing an output signal on said buffer means output lead having a value depending on said input voltage, said buffer means exhibiting a continuous transfer function, said buffer means going into a three-state mode in response to a three-state control signal on said three-state control lead, wherein said buffer means provides substantially no current on said buffer means output lead when said buffer means is in said three-state mode and wherein said buffer means consumes substantially no power when said buffer means is in said three-state mode; and
   means for causing said buffer means input lead and buffer means output lead to be held at a third voltage between said first and second voltages when said buffer means is in said three-state mode, said means for causing comprising a first switch coupled across said buffer means input and output leads.

2. Circuit of claim 1 wherein said buffer means is an inverter, said three-state control lead being coupled to said inverter, said inverter going into said three-state mode in response to said three-state control signal on said three-state control lead.

3. Circuit of claim 1 wherein said means for causing comprises:
   a first inverter having an inverter input lead and an inverter output lead, said inverter output lead being coupled to said buffer means input lead;
   a second switch for selectively coupling said inverter input lead to said inverter output lead so that when said second switch is closed, the voltage at said inverter input lead substantially equals the voltage at said inverter output lead, and wherein said first switch is closed during a time period in which said second switch is closed.

4. Circuit of claim 3 wherein said inverter input lead is coupled to a memory device sense amplifier.

5. Circuit of claim 4 wherein said buffer means output lead is coupled to the input lead of a second inverter.

6. Circuit of claim 4 further comprising:
   a common node coupled to said buffer means output lead;
   a plurality of buffers, each buffer having a buffer input lead, a buffer output lead coupled to said common node, and a lead for receiving a three-state control signal;
   means for providing signals on said buffer input leads; and
   means for generating the three-state control signals received by said plurality of buffers and said buffer means so that only one of said buffers and buffer means provides data on said common node at a time.

7. Circuit comprising:
   a first inverter having an input lead and an output lead;
   means for driving said input lead with a first voltage or a second voltage, thereby communicating a binary value on said input lead, said first inverter receiving the voltage on said input lead and providing an output signal on said output lead in response thereto, said means for driving also being capable of driving said input lead with a third voltage between said first and second voltages;
   means for causing said first inverter to enter a high impedance mode so that the power consumed by said first inverter does not substantially increase when said input lead receives said third voltage;
   a second inverter having an input lead coupled to the output lead of said first inverter, said second inverter including an output lead; and
   transfer gate means for selectively coupling the output lead of said second inverter to the input lead of said second inverter, the output impedance of said first inverter being less than the output impedance of said second inverter so that when said transfer gate means couples the output lead of said second inverter to the input lead of said second inverter, said first inverter is capable of driving the input lead of said second inverter with a binary value.

8. Circuit of claim 7 wherein said first inverter comprises a plurality of transistors and said second inverter comprises a plurality of transistors, said transistors in said first inverter having a width at least five times the width of the transistors in said second inverter.

9. Circuit comprising:
   a first plurality of inverters, each inverter having an input lead, an output lead, and a high impedance mode control lead, said plurality of inverters going into a high impedance mode in response to a high impedance mode control signal on said high impedance mode control lead;
   a node, the output leads of each of said inverters within said first plurality being coupled to said node;
   a first plurality of switches, each switch selectively coupling the input lead of an associated one of said inverters to the output lead of said associated one of said inverters; and
   control means coupled to said high impedance mode control leads and coupled to said switches for controlling the state of said switches, said control means also controlling whether said inverters are in said high impedance mode such that only one of said inverters is in a low impedance mode at a time, and wherein when said one of said inverters is in said low impedance mode, said switches are open.

10. Circuit of claim 9 further comprising means for holding the input and the output leads of each of said inverters within said first plurality of inverters at a voltage between the binary voltage levels used by said inverters when said switches are closed, said means for holding including:
- a second plurality of inverters, each inverter within said second plurality having an output lead coupled to the input lead of an associated one of said inverters within said first plurality of inverters;
- a second plurality of switches, each switch within said second plurality of switches being coupled across the input and output leads of an associated one of said inverters within said second plurality of inverters.

11. Circuit for providing an output signal, said circuit comprising:
- buffer means having a buffer means input lead for receiving an input voltage at or between a first voltage and a second voltage, a buffer means output lead, and a three-state control lead, said buffer means providing an output signal on said buffer means output lead having a value depending on said input voltage, said buffer means exhibiting a continuous transfer function, said first buffer means going into a three-state mode in response to a three-state control signal on said three-state control lead, wherein said buffer means provides substantially no current on said buffer means output lead when said buffer means is in said three-state mode and wherein said buffer means consumes substantially no power when said buffer means is in said three-state mode; and
- means for causing said buffer means input lead and buffer means output lead to be held at a third voltage between said first and second voltages when said buffer means is in said three-state mode.

* * * * *